United States Patent
Li et al.

(10) Patent No.: US 10,440,813 B1
(45) Date of Patent: Oct. 8, 2019

(54) MICROELECTRONIC MODULES INCLUDING THERMAL EXTENSION LEVELS AND METHODS FOR THE FABRICATION THEREOF

(71) Applicant: NXP USA, INC., Austin, TX (US)

(72) Inventors: Lu Li, Gilbert, AZ (US); Elie A. Maalouf, Mesa, AZ (US); Lakshminarayan Viswanathan, Phoenix, AZ (US); Mahesh K. Shah, Scottsdale, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/022,125

(22) Filed: Jun. 28, 2018

(51) Int. Cl.
  *H01K 1/02* (2006.01)
  *H05K 1/02* (2006.01)
  (Continued)

(52) U.S. Cl.
  CPC ....... *H05K 1/0204* (2013.01); *H01L 21/4821* (2013.01); *H01L 21/4882* (2013.01); *H01L 23/3675* (2013.01); *H01L 23/49541* (2013.01); *H01L 24/48* (2013.01); *H01L 25/16* (2013.01); *H05K 1/11* (2013.01); *H05K 1/144* (2013.01);
  (Continued)

(58) Field of Classification Search
  CPC ....... H01L 2924/00; H01L 2224/48227; H01L 2224/73265; H01L 2224/32225; H01L 2224/32245; H01L 2924/351; H01L 23/4334; H01L 2924/01013; H01L 23/3677; H01L 23/34; H01L 23/5384; H01L 2924/1517; H01L 23/15; H05K 1/0204; H05K 1/182; H05K 1/0203;
  (Continued)

(56) References Cited

U.S. PATENT DOCUMENTS

| 5,856,911 A * | 1/1999 | Riley | G06F 1/203 |
| | | | 174/16.3 |
| 6,882,042 B2 * | 4/2005 | Zhao | H01L 23/16 |
| | | | 257/706 |

(Continued)

OTHER PUBLICATIONS

Viswanathan, L., U.S. Appl. No. 15/832,479, entitled "Microelectronic Components Having Integrated Heat Dissipation Posts, Systems Including the Same, and Methods for the Fabrication Thereof," filed Dec. 5, 2017.

*Primary Examiner* — Mandeep S Buttar

(57) ABSTRACT

High thermal performance microelectronic modules containing thermal extension levels are provided, as are methods for fabricating such microelectronic modules. In various embodiments, the microelectronic module includes a module substrate having a substrate frontside and a substrate backside. At least one a microelectronic device, such as a semiconductor die bearing radio frequency circuitry, is mounted to the substrate frontside. A substrate-embedded heat spreader, which is thermally coupled to the microelectronic device, is at least partially contained within the module substrate, and extends to the substrate backside. A thermal extension level is located adjacent the substrate backside and extends away from the substrate backside to terminate at a module mount plane. The thermal extension level contains a heat spreader extension, which is bonded to and in thermal communication with the substrate-embedded heat spreader.

16 Claims, 9 Drawing Sheets

(51) Int. Cl.
*H05K 1/14* (2006.01)
*H05K 1/11* (2006.01)
*H05K 3/00* (2006.01)
*H05K 3/36* (2006.01)
*H01L 23/367* (2006.01)
*H01L 23/495* (2006.01)
*H01L 21/48* (2006.01)
*H01L 23/00* (2006.01)
*H01L 25/16* (2006.01)
*H05K 1/18* (2006.01)

(52) U.S. Cl.
CPC ............ H05K 1/181 (2013.01); H05K 3/0061 (2013.01); H05K 3/368 (2013.01); *H01L 2224/48091* (2013.01); *H01L 2224/48106* (2013.01); *H01L 2224/48247* (2013.01); *H01L 2924/19105* (2013.01); *H05K 2201/041* (2013.01); *H05K 2201/066* (2013.01); *H05K 2201/10378* (2013.01); *H05K 2201/10522* (2013.01); *H05K 2203/061* (2013.01); *H05K 2203/1131* (2013.01)

(58) Field of Classification Search
CPC .............. H05K 1/0207; H05K 1/0218; H05K 7/20154; H05K 7/2039; H05K 2201/066
USPC ................. 361/709, 688, 707; 257/713, 706, 257/E23.101, E23.069, E23.08, 720; 438/122
See application file for complete search history.

(56) References Cited

U.S. PATENT DOCUMENTS

| | | | |
|---|---|---|---|
| 7,102,225 B2 | 9/2006 | Khan et al. | |
| 7,132,744 B2 | 11/2006 | Zhao et al. | |
| 7,161,239 B2 | 1/2007 | Zhao et al. | |
| 7,196,415 B2 | 3/2007 | Zhong et al. | |
| 7,227,256 B2 | 6/2007 | Zhao et al. | |
| 7,259,448 B2 | 8/2007 | Zhang et al. | |
| 7,259,457 B2 | 8/2007 | Zhang et al. | |
| 7,432,586 B2 | 10/2008 | Zhao et al. | |
| 7,462,933 B2 | 12/2008 | Zhao et al. | |
| 7,566,590 B2 | 7/2009 | Zhong et al. | |
| 7,781,882 B2 | 8/2010 | Zhong et al. | |
| 7,859,101 B2 | 12/2010 | Zhao et al. | |
| 7,893,546 B2 | 2/2011 | Zhao et al. | |
| 8,183,680 B2 | 5/2012 | Zhao et al. | |
| 8,310,067 B2 | 11/2012 | Zhao et al. | |
| 8,686,558 B2 | 4/2014 | Zhao et al. | |
| 2010/0213603 A1* | 8/2010 | Smeys | H01L 21/4853 257/698 |
| 2014/0291843 A1* | 10/2014 | Jiang | H01L 23/49816 257/738 |
| 2015/0179617 A1* | 6/2015 | Lin | H01L 25/0657 257/713 |
| 2016/0095203 A1* | 3/2016 | Min | H05K 1/0207 361/690 |
| 2018/0153030 A1 | 5/2018 | Viswanathan et al. | |

\* cited by examiner

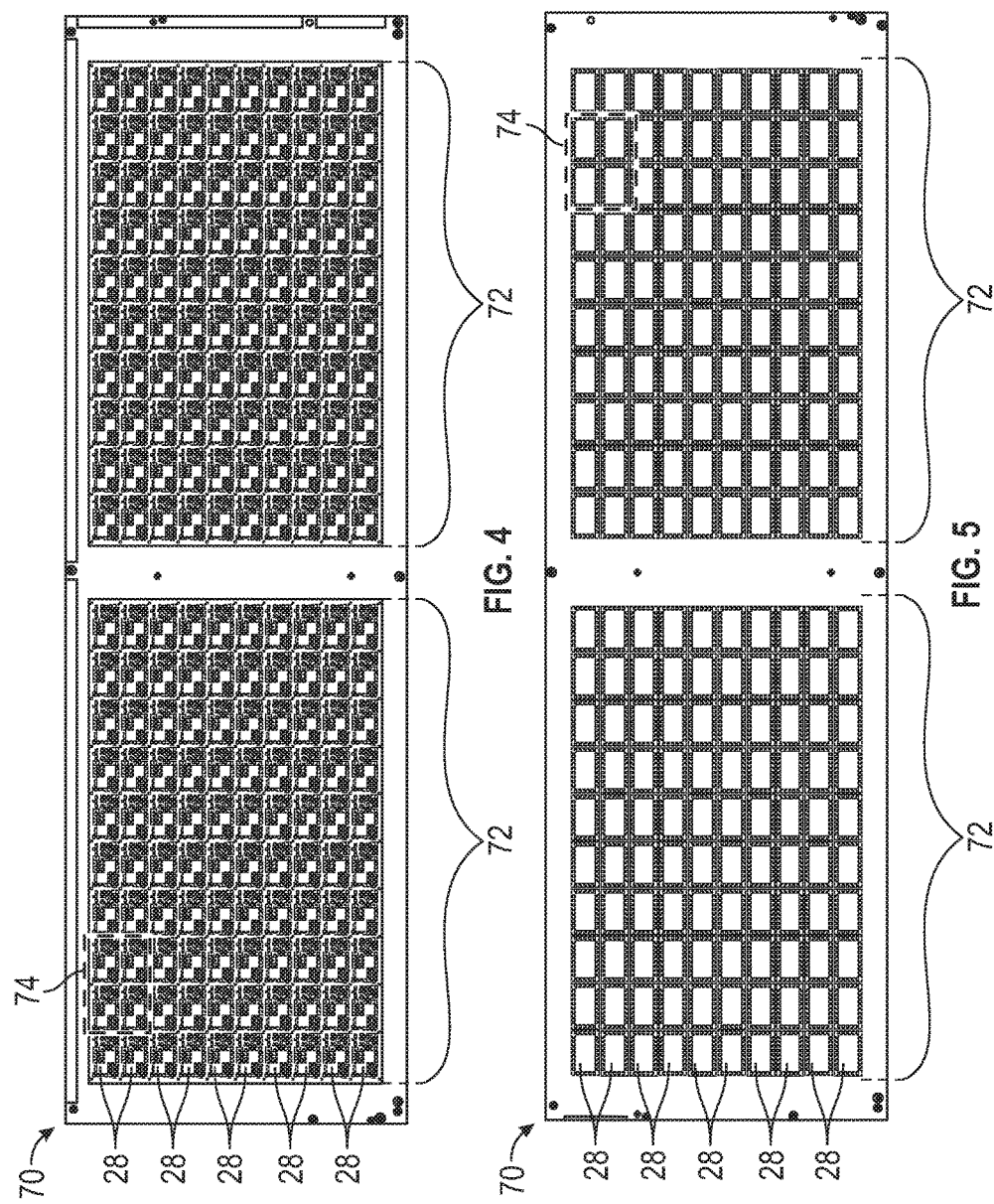

MICROELECTRONIC MODULES INCLUDING THERMAL EXTENSION LEVELS AND METHODS FOR THE FABRICATION THEREOF

TECHNICAL FIELD

Embodiments of the present disclosure relate generally to microelectronics and, more particularly, to high thermal performance microelectronic modules containing thermal extension levels and to methods for fabricating such microelectronic modules.

ABBREVIATIONS

Abbreviations appearing relatively infrequently in this document are defined upon initial usage, while abbreviations appearing more frequently in this document are defined below.

Cu—Copper;
PCB—Printed Circuit Board;
RF—Radio Frequency;
MEMS—Microelectromechanical Systems;
SMD—Surface Mount Device;
RF—Radio Frequency; and
° C.—degree Celsius.

BACKGROUND

High power microelectronic modules, such as modules containing RF semiconductor die and other circuitry, are often prone to excess heat generation during module operation. In the absence of an adequate thermal solution for dissipating heat from the module, elevated local temperatures or "hot spots" can develop within the microelectronic module and detract from module performance. Existing thermal solutions implemented by manufacturers typically rely upon increasing the metal content within the module substrate in some manner; e.g., by forming bar vias within the body of the module substrate or by installing a prefabricated metal body, such as a Cu coin or slug, within a cavity formed in the module substrate. Such thermal solutions are generally effective at enhancing heat dissipation from microelectronic modules containing heat-generating devices, within limits. Nonetheless, there exists a continued demand within the microelectronic industry for still further enhancements in the heat dissipation capabilities of microelectronic modules.

BRIEF DESCRIPTION OF THE DRAWINGS

At least one example of the present invention will hereinafter be described in conjunction with the following figures, wherein like numerals denote like elements, and:

FIGS. 4 and 5 are frontside and backside views, respectively, of a plurality of module substrates interconnected as a multi-substrate strip or panel, which is processed during an exemplary method for fabricating a plurality of high thermal performance microelectronic modules in parallel;

Figure 1:
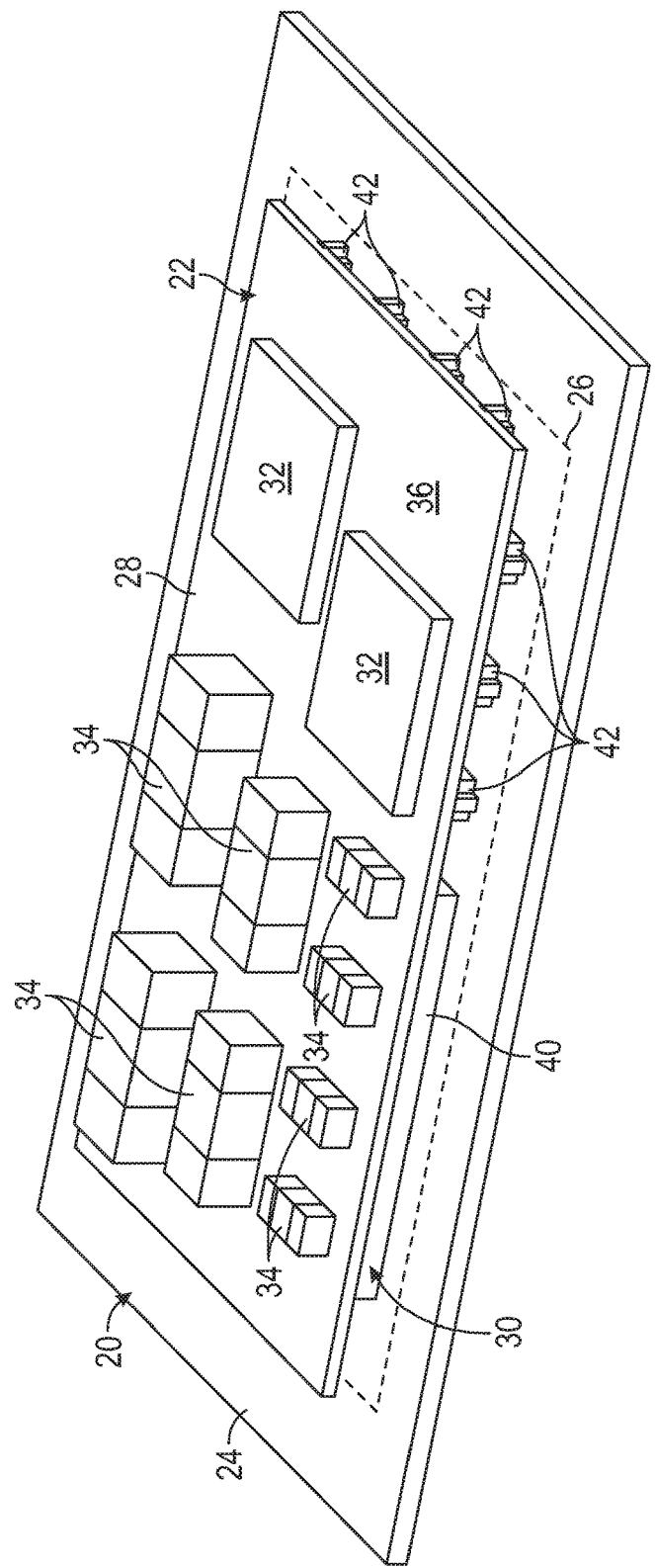
FIG. 1 is an isometric view of a system substrate (partially shown) and a high thermal performance microelectronic module, which includes a prefabricated thermal extension level positioned against and bonded to the system substrate, as illustrated in accordance with an exemplary embodiment of the present disclosure.

For simplicity and clarity of illustration, descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. The term "exemplary," as appearing throughout this document, is synonymous with the term "example" and is utilized repeatedly below to emphasize that the following description provides only multiple non-limiting examples of the invention and should not be construed to restrict the scope of the invention, as set-out in the Claims, in any respect. Terms of orientation, such as "upper," "lower," and "underneath," as appearing throughout document, are defined with respect to the frontsides and the opposing backsides of the below-described module substrates.

Definitions

The following definitions apply throughout this document. Those terms not expressly defined here or elsewhere in this document are assigned their ordinary meaning in the relevant technical field.

Heat spreader extension—a thermally-conductive structure contained in a thermal extension level (defined below), bonded to a substrate-embedded heat spreader (also defined below), and in thermal communication with the substrate-embedded heat spreader.

Metallic material—a material predominately composed of metallic constituents, by weight percentage.

Microelectronic device—any small scale device or component mounted to a module substrate and having electronic functionalities, whether passive or active in nature. A non-exhaustive list of microelectronic devices includes semiconductor die, sensors, RF antenna structures, RF or Electromagnetic Interference (EMI) shield structures, MEMS devices, and passive SMDs in the form of discrete resistors, inductors, diodes, and capacitors, such as chip caps.

Substrate-embedded heat spreader—a thermally-conductive structure, such as a monolithic body or composite structure, that aids in heat dissipation through a module substrate and that is substantially or wholly embedded in the module substrate.

Thermally-conductive—having a thermal conductivity exceeding 5 watts per meter-Kelvin (W/mK).

Thermal extension level—any number of thermally-conductive and, perhaps, electrically-conductive structures located adjacent the backside of a module substrate, generally distributed along a common plane, and including at least one structure (herein, a "heat spreader extension") in thermal communication with a substrate-embedded heat spreader, as defined above.

Overview

The following describes high thermal performance microelectronic modules including thermal extension levels, as well as methods for manufacturing high thermal performance microelectronic modules. As indicated by the term "high thermal performance," the below-described microelectronic modules contain unique structures or features enhancing thermal dissipation of excess heat generated by microelectronic devices, such as semiconductor (e.g., RF) die and other circuitry, contained within a given module. Such structures will typically include, at minimum, a heat spreader extension, which is contained in a thermal extension level located adjacent the backside of a module substrate and directly or indirectly bonded to the thermal extension level. In embodiments, the heat spreader extension may be bonded to a lower principal surface of a heat spreader, which is embedded within the module substrate and which has a surface substantially coplanar with the backside thereof. In certain implementations, the heat spreader extension may be directly bonded to the substrate-embedded heat spreader by, for example, forming the heat spreader extension from a plated material (e.g., plated Cu) deposited directly onto the exposed surface of the substrate-embedded heat spreader. Alternatively, the heat spreader extension may provided as a prefabricated piece or part, such as a singulated piece of a leadframe or a discretely-placed component, which is bonded to the substrate-embedded heat spreader by a thermally-conductive material.

Through the inclusion of such a heat spreader extension, the thermal dissipation capabilities of the microelectronic module can be increased to promote conductive heat flow away from heat-generating device(s) contained within the module. Additionally, the heat spreader extension and the substrate-embedded heat spreader may cooperate or combine to form a highly conductive thermal conduit, which extends from an upper portion of the module substrate (perhaps from the substrate frontside), through the substrate body, through the heat spreader extension, and to a mount plane of the module. Excess heat generated during module operation may thus be conductively transferred from the heat-generating device(s) within the module, through the substrate-embedded heat spreader, through the heat spreader extension, and to a larger system substrate on which the microelectronic module is installed. Finally, the heat spreader extension and, more generally, the thermal extension level may be unencapsulated and directly exposed to the ambient environment to further promote convective transfer of excess heat from the module to the surrounding environment. For these reasons, the provision of such a heat spreader extension can favorably enhance thermal performance of the microelectronic module. Additionally, the heat spreader extension may be electrically active in at least some embodiments and, perhaps, may cooperate with the substrate-embedded heat spreader (and possibly other electrical routing features) to form an electrical grounding path through the module substrate and to microelectronic devices, such as semiconductor die bearing RF circuitry, mounted to the substrate frontside.

In certain implementations, the thermal extension level may include other structures or features in addition to the above-described heat spreader extension, such as a number of electrically-conductive contact bridges or "terminal extensions." When included in the thermal extension layer, such terminal extensions may be joined to electrical terminals, such as contact pads, embedded in the module substrate. Opposite the substrate-embedded terminals, the terminal extensions may terminate along with the heat spreader extension at a common plane, which is referred to herein as "a module mount plane." Such a structural configuration allows the high thermal performance microelectronic module to be mounted to a system substrate, and electrically interconnected with contact pads or other terminals provided on the system substrate, in essentially the same manner as are conventional microelectronic modules lacking thermal extension levels, thereby easing customer adoption. In other embodiments, the thermal extension level may not contain terminal extensions; e.g., as may be the case when a different interconnect approach, such as wirebonding, is utilized to supply power to, to electrically ground, and/or to permit signal communication with the microelectronic devices contained within the module. Examples of high thermal performance microelectronic modules having thermal extension levels and methods for manufacturing microelectronic modules will now be described in conjunction with FIGS. 1-9.

Exemplary Embodiment of High Thermal Performance Module

Turning now to FIG. 1, there is shown a simplified cross-sectional view of a system substrate 20 (partially shown) to which a high thermal performance microelectronic module 22 is mounted, as illustrated accordance with an exemplary embodiment of the present disclosure. System substrate 20 is depicted in a generalized manner to emphasize that microelectronic module 22 can be utilized in conjunction with various types of system substrates, without limitation, providing that the selected system substrate is capable of supporting module 22 and, perhaps, serves as a heatsink to which heat extracted from module 22 can be conductively transferred. Substrate 20 usefully, but non-essentially includes interconnect lines, metal traces, contact or landing pads, and/or other electrically-conductive routing features (not shown) to which the terminals of module 22 can be interconnected. Again, only a limited portion of system substrate 20 is shown in FIG. 1, with the non-illustrated portions of substrate 20 potentially supporting any number and type of additional microelectronic devices, modules, and other components.

As just stated, system substrate 20 can assume any form suitable for supporting microelectronic module 22, such as a coreless substrate. In the illustrated example, system substrate 20 is realized as a multilayer PCB and is consequently referred to hereafter as "PCB 20." PCB 20 can include any practical number of patterned metal levels or wiring layers, which are hidden from view in FIG. 1 for illustrative clarity. Typically, PCB 20 will include at least one patterned metal layer or level formed on PCB frontside 24, which defines interconnect lines (e.g., Cu traces), contact pads, and other such routing features. An additional metal level or wiring layer may be formed on the backside of PCB 20, and any practical number of internal wiring layers may be formed within PCB 20 when composed of multiple layers or laminates. PCB 20 may also contain a number of plated vias, metal plugs, or similar electrically-conductive structures, which provide electrically-conductive paths entirely or partially through the thickness of PCB 20; the term "thickness," as appearing herein, refers to a dimension measured along an axis orthogonal to the backside of module substrate 28 (e.g., a dimension extending between frontside 24 and the backside of the PCB 20, or between frontside 28 and the backside of module 22). In certain cases, PCB 20 may also be formed to include one or more thermally-conductive structures, which serve as a heatsink to which excess heat extracted from microelectronic module 22 is conductively transferred. This possibility is indicated in FIG. 1 by dashed region 26, which generically represents a thermally-conductive structure (e.g., a via farm or a thermally-conductive slug, such as a coin composed of Cu or another thermally-conductive material) over which microelectronic module 22 may be mounted. Such a thermally-conductive structure (e.g., via farm or coin) may thus serve as both a heatsink for microelectronic module 22 and to provide electrical grounding of the devices within module 22 in at least some implementations.

Microelectronic module 22 contains a module substrate 28, a thermal extension level 30, and a number of microelectronic devices 32, 34. Microelectronic devices 32, 34 are distributed at various locations across substrate frontside 36. Microelectronic devices 32, 34 can be electrically interconnected utilizing any type of interconnect features, which are not shown in FIG. 1 to avoid cluttering the drawing. Such interconnect structures will often assume the form of metallic (e.g., Cu) traces and pads formed on PCB frontside 24 utilizing lithography and metallization processes. Other types of interconnect features can be equivalently utilized, however, including wirebonding and/or three dimensionally printed metal traces (e.g., as may be printed utilizing ink containing metallic particles), which conformally extending along surfaces of substrate 28 and perhaps devices 32, 34. The particular manner in which microelectronic devices 32, 34 are interconnected may vary depending upon the desired functionality of microelectronic module 22, as will the type of devices 32, 34 contained in module 22. Generally, microelectronic devices 32, 34 can include any number and type of semiconductor die (e.g., memory die or Application Specification Integrated Circuit (ASIC) die), MEMS devices, and SMDs, such as discrete or passive capacitors (e.g., chip caps), inductors, resistors, and diodes, to list but a few examples. In the depicted embodiment, and by way of non-limiting illustration, microelectronic devices 32 assume the form of circuit-bearing (e.g., RF) semiconductor die, while microelectronic devices 34 assume the form of passive SMDs, such as discrete capacitors, resistors, or inductors.

Figure 2:
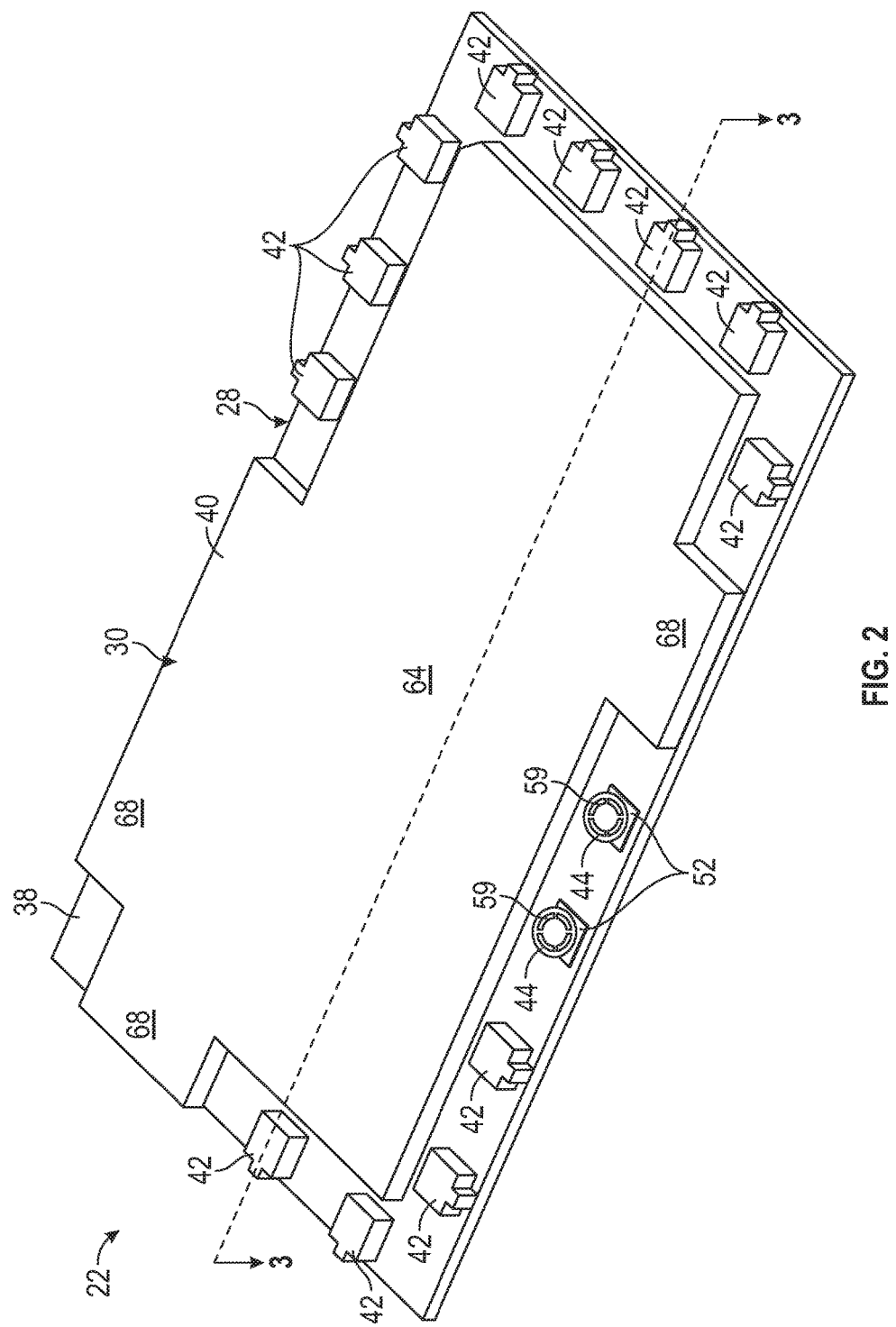
FIG. 2 is a further isometric view of the microelectronic module shown in FIG. 1, presented from the module backside to better illustrate the thermal extension level.
Figure 3:
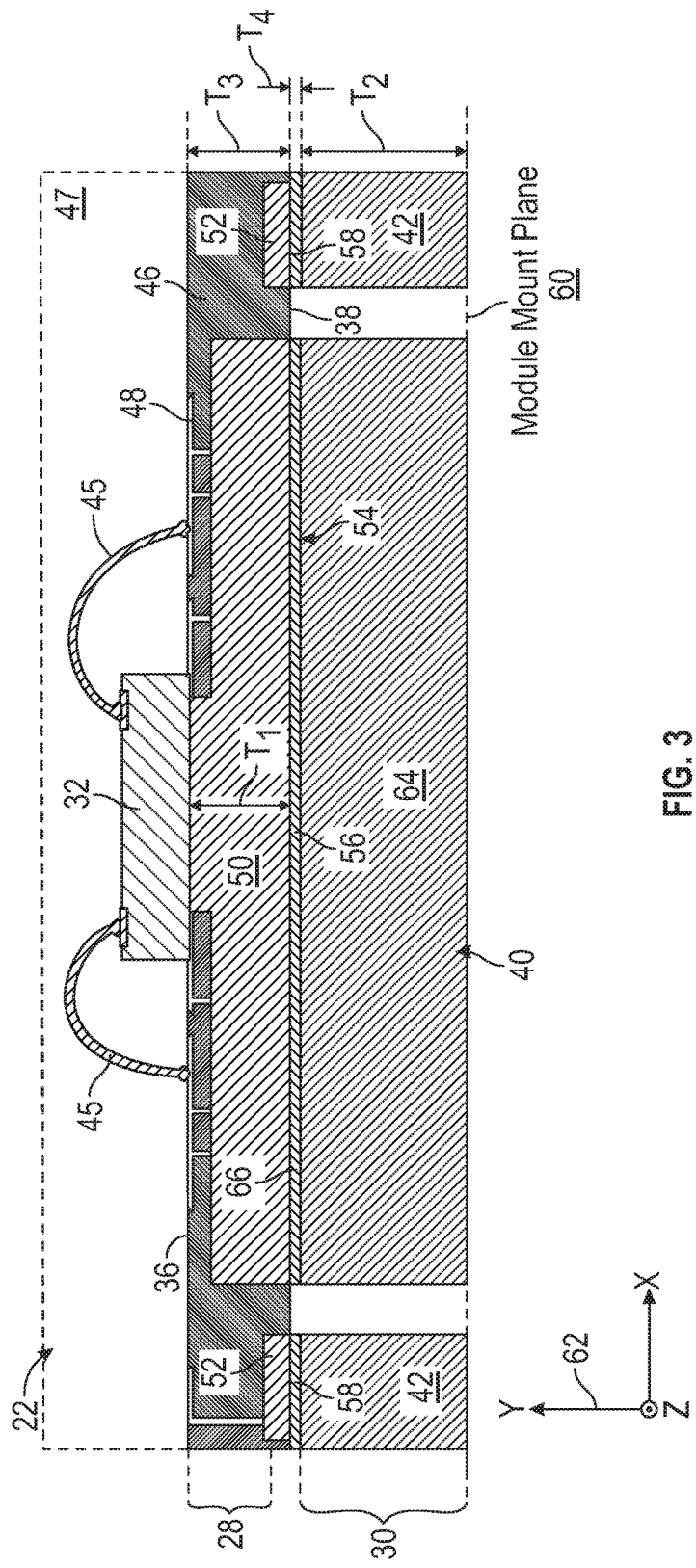
FIG. 3 is a cross-sectional view of the microelectronic module shown in FIGS. 1-2, taken along section plane 3-3 (identified in FIG. 2) and depicted with the microelectronic devices hidden from view.

Referring now to FIGS. 2 and 3 in combination with FIG. 1, microelectronic module 22 will be described in greater detail. Addressing first substrate 28, module substrate 28 can assume any form suitable for supporting microelectronic devices 32, 34, such as a PCB or a coreless substrate. Module substrate 28 usefully contains electrical routing features, such as electrically-conductive traces; however, this is not required in all embodiments. In the exemplary embodiment of FIGS. 1-3, specifically, module substrate 28 is realized as a multilayer PCB containing a number of internal wiring layers or metal levels. This may be most readily appreciated by reference to FIG. 3, which is a cross-sectional view of module 22 taken along line 3-3 in FIG. 2. Accordingly, module substrate 28 includes a dielectric body 46 and multiple metal levels or wiring layers 48 (also referred to herein as "electrical routing features"), which are contained within body 46, spaced along the centerline of module 22 (parallel to the Y-axis identified by coordinate legend 62 in FIG. 3), and interconnected by plated vias, metal plugs, or similar structures. Dielectric body 46 thus has a multi-layered construction in the illustrated embodiment. Dielectric body 46 may be composed of a resin, polymeric material (e.g., a polyimide or polytetrafluoroethylene (PTFE)), and various other dielectric materials.

One of microelectronic devices 32 mounted to frontside 36 of module substrate 28 is shown in FIG. 3. Wirebonds 45 are further shown, which electrically couple the bond pads of the illustrated device 32 to corresponding contacts provided on substrate frontside 36. As indicated in FIG. 3 by phantom line, the illustrated microelectronic device 32 and the other microelectronic devices 32, 34 shown in FIG. 1 can be surrounded by some form of an enclosure 47 in at least some instances. In certain embodiments, enclosure 47 may assume the form of an overmolded body, which is composed of a mold compound (or other moldable dielectric material) injected over module substrate 28. In other embodiments, enclosure 47 may assume the form of a box-like structure, which includes a peripheral sidewall enclosed by a lid or cover. The peripheral sidewall and lid may thus define an air cavity in which microelectronic devices 32, 34 are located. In still other embodiments, enclosure 47 may assume a different form or may be omitted from microelectronic module 22.

As further shown in FIG. 3, a substrate-embedded heat spreader 50 is contained within dielectric body 46. In certain embodiments, substrate-embedded heat spreader 50 can assume the form of a plated metal body or block, which is compiled on a layer-by-layer basis during the metallization processes utilized to successively form wiring layers 48. Alternatively, substrate-embedded heat spreader 50 can assume the form of a prefabricated structure or discrete piece part, which is installed within a central cavity provided in module substrate 28 and secured in place by press-fit and/or utilizing a suitable bonding material. In this latter case, substrate-embedded heat spreader 50 may be fabricated to have a monolithic, composite, or layered construction. For example, in certain implementations, substrate-embedded heat spreader 50 may assume the form of a thermally-conductive piece (e.g., a metal slug) or an elongated thermal conduit (e.g., a heat pipe), which is affixed within the one or more cavities provided in substrate 28 utilizing a thermally-conductive bonding material, such as a sintered bond layer of the type described below. Further description of thermally-conductive structures suitable for usage as heat spreader 50 can be found in the following document, which is incorporated by reference: U.S. Pat. App. Publication No. 2018/0153030, entitled "MICROELECTRONIC MODULES WITH SINTER-BONDED HEAT DISSIPATION STRUCTURES AND METHODS FOR THE FABRICATION THEREOF," and filed with the United States Patent and Trademark Office (USPTO) on Nov. 19, 2016.

Regardless the particular form assumed thereby, substrate-embedded heat spreader 50 will typically be composed of a material, or combination of materials, having a thermal conductivity exceeding that of dielectric body 46. In many cases, substrate-embedded heat spreader 50 will be composed of a metallic material, such as Cu, aluminum (Al), or nickel (Ni), and alloys thereof. In other embodiments, and as briefly mentioned above, substrate-embedded heat spreader 50 may be fabricated from a composite material or a non-metallic material having relatively high thermal conductivities. Such materials include, but are not limited to, diamond polycarbonate materials, diamond-metal composites (e.g., diamond gold (Au), diamond silver (Ag), and diamond Cu), pyrolytic graphite, and materials containing allotropes of carbon, such as graphene and carbon nanotube-filled materials. In one specific, albeit non-limiting example, substrate-embedded heat spreader 50 is formed as a plated metal block having a volume equal to or greater than one half of the volume of module substrate 28. In other embodiments, substrate-embedded heat spreader 50 may be formed or provided in a different manner and/or may have a volume less than one half that of substrate 28.

Figure 6:
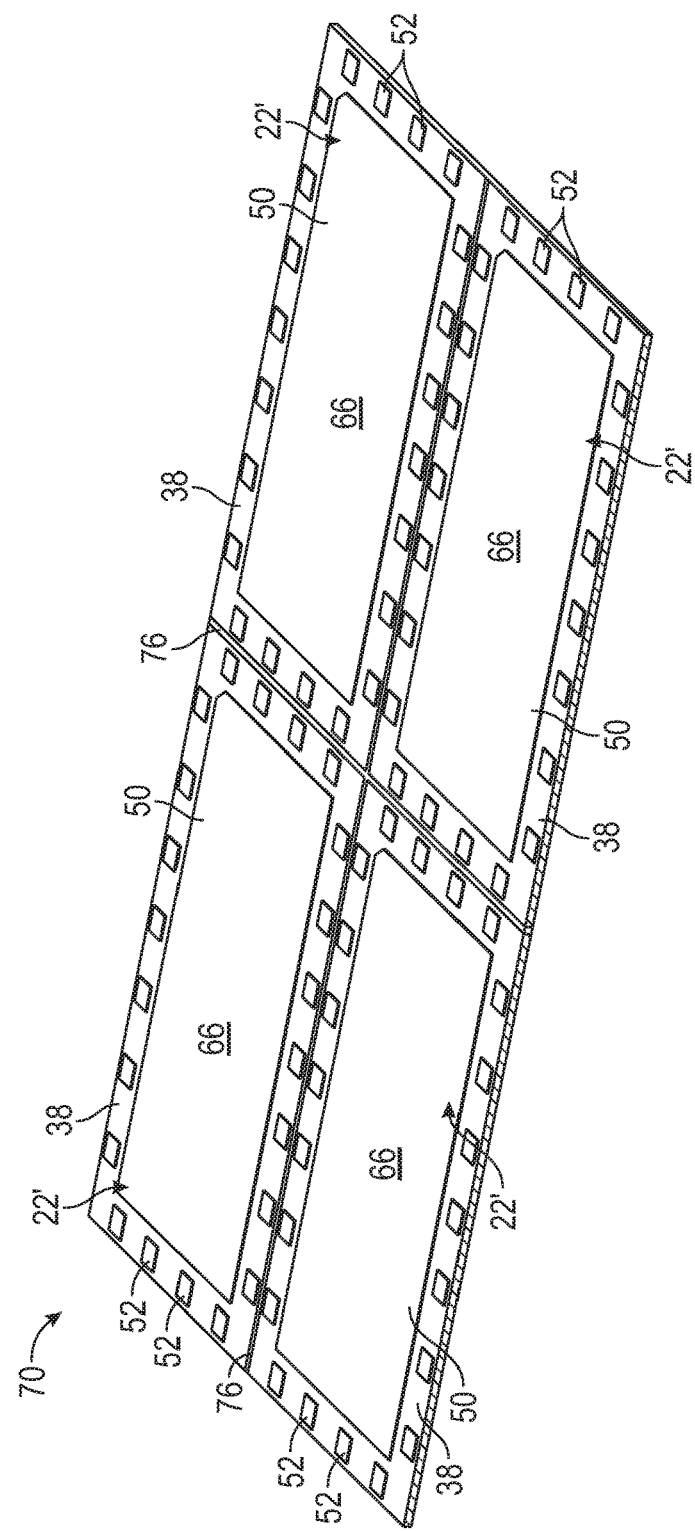
FIGS. 6-8 illustrate a limited number of interconnected module substrates, as contained in the multi-substrate panel shown in FIGS. 4-5 and shown during various stages of processing.

As shown in FIGS. 2 and 3, microelectronic module 22 further includes a plurality of contact pads or terminals 52, which are at least partially embedded in module substrate 28 and referred to hereafter as "substrate-embedded terminals 52." As with substrate-embedded heat spreader 50, substrate-embedded terminals 52 are exposed at and/or substantially extend to or beyond substrate backside 38. Substrate-embedded terminals 52 may have lower principal surfaces substantially coplanar with the lower principal surface or backside 66 of substrate-embedded heat spreader 50. Substrate-embedded terminals 52 can be provided in various different manners, including as prefabricated conductive pieces that are placed in desired positions and enveloped by dielectric body 46 when formed utilizing an overmolding process. Alternatively, when module substrate 28 assumes the form of a multi-layer PCB, as shown, substrate-embedded terminals 52 may be formed during the metallization processes utilized to form the lower metal level or levels within module substrate 28. In either case, substrate-embedded terminals 52 may be electrically coupled to microelectronic devices 32, 34 through electrical routing features or wiring layers 48 contained in module substrate 28. As best shown in FIG. 6 (described below), substrate-embedded terminals 52 may be distributed around a lower periphery of substrate-embedded heat spreader 50, while being spatially offset therefrom and electrically isolated by intervening portions of dielectric body 46. In other embodiments, the spatial distribution of substrate-embedded terminals 52 may vary, as may the shape and dimensions of terminals 52 and/or heat spreader 50.

A patterned thermally-conductive bond layer 54 joins thermal extension level 30 to substrate-embedded heat spreader 50 and substrate-embedded terminals 52. Thermally-conductive bond layer 54 may be deposited or otherwise applied in a pattern, which includes a heat spreader-contacting portion 56 and a number of terminal-contacting portions 58. Heat spreader-contacting portion 56 bonds heat spreader extension 40 to lower principal surface or backside 66 of substrate-embedded heat spreader 50, while terminal-contacting portions 58 bond terminal extensions 42 to substrate-embedded terminals 52. Patterned thermally-conductive bond layer 54 need not attach all of structures contained in thermal extension level 30 to module substrate 28, however. In some implementations, one or more of the structures contained in thermal extension level 30 may be imparted with a solder finish, which is reflowed to form the desired joints between components. This possibility is indicated in FIG. 2 in which terminal extensions 44 are depicted as solder-covered contacts, which are electrically and mechanically attached to a corresponding pair of substrate-embedded terminals 52 by solder reflow during the fabrication of microelectronic module 10. Terminal extensions 44 may each assume the form of soldered-covered spherical contacts or balls, which each contain an inner (e.g., Cu or Au) core having a first thermal conductivity (represented in FIG. 2 by dashed circles 59) and further contains an outer shell composed of a solder material having a second thermal conductivity less than the first thermal conductivity. In still other embodiments, all structures contained in thermal extension level 30 may be joined to module substrate 28 by solder reflow, whether applied as a paste or finish.

Thermally-conductive bond layer 54 can be composed of various materials providing a desired mechanical bond strength, while possessing a relatively high thermal conductivity; e.g., a thermal conductivity exceeding 30 W/mK. Additionally, when utilized to provide electrical connections, bond layer 54 also usefully has a relatively high electrical conductivity. Candidate materials include, but are not limited to, metal-filled (e.g., Cu-, Au-, and Ag-filled) epoxies, solder materials (e.g., deposited solder pastes), and other die attach materials having the aforementioned properties. In one group of embodiments, thermally-conductive bond layer 54 is formed from a sintered metallic material predominately composed of one or more metallic constituents, by weight percentage (wt %). Advantageously, when so composed, thermally-conductive bond layer 54 can achieve relatively high thermal conductivities and may be formed from a metal-particle containing precursor material utilizing a low temperature sintering process. Given these advantages, the following will primarily describe thermally-conductive bond layer 54 as "sintered bond layer 54" hereafter. It is again emphasized, however, that this description is provided by way of non-limiting illustration only and that bond layer 54 can be composed of various other thermally-conductive bonding materials in alternative embodiments.

As noted above, sintered bond layer 54 may be predominately composed of at least one metal, as considered by wt %. In one embodiment, sintered bond layer 54 is predominately composed of Cu, Ag, Au, or a mixture thereof, again as considered by wt %. Sintered bond layer 54 may or may not contain organic materials. For example, in certain implementations, sintered bond layer 54 may be essentially free of organic materials; the term "essentially free," as appearing herein, defined as containing less than 1 wt % of organic materials. In other embodiments, sintered bond layer 54 may contain selected organic materials or fillers to tailor the properties of bond layer 54. For example, in certain instances, sintered bond layer 54 may contain an epoxy or another organic material. In one implementation, sintered bond layer 54 is composed of a sintered metal (e.g., Ag) material having a thermal conductivity exceeding 50 W/mK and, perhaps, a thermal conductivity equal to or exceeding about 70 W/mK. Additionally, sintered bond layer 54 may be produced to have a desired porosity, which may range from 0% to 30% by volume in an embodiment. In another embodiment, sintered bond layer 54 may be formed to each have a porosity of less than 1% by volume.

Figure 10:
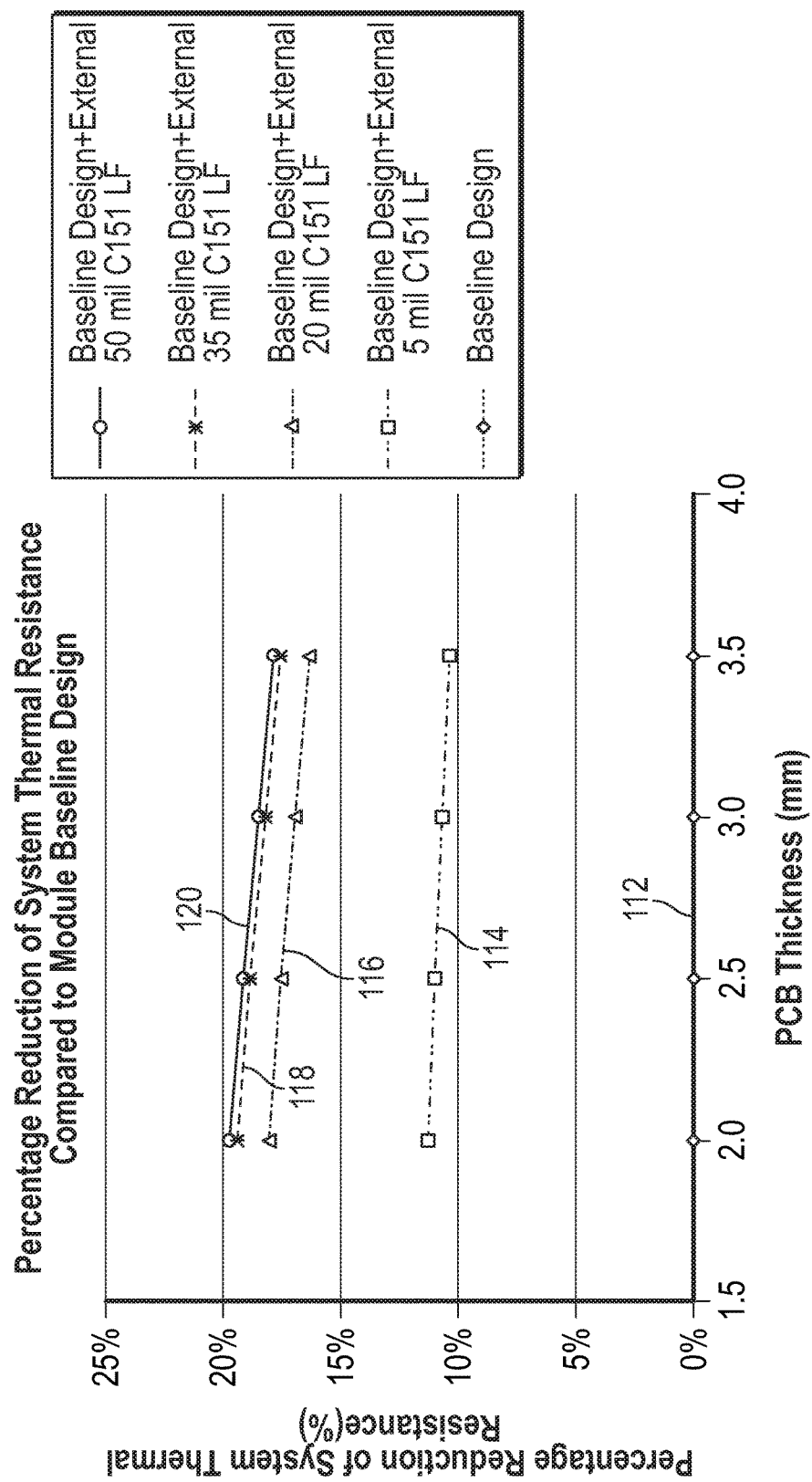
FIG. 10 is a graph plotting the results of a computer simulation comparing the thermal performance of a conventional microelectronic module containing bar vias to that of two exemplary implementations of the high thermal performance microelectronic module described herein.

With continued reference to FIGS. 1-3, the respective lower surfaces of heat spreader extension 40 and terminal extensions 42, 44 are substantially coplanar and, thus, co-terminate at a module mount plane 60 (FIG. 3). Module mount plane 60 extends substantially parallel to substrate backside 38, while being offset therefrom by a predetermined distance. Extensions 40, 42, 44 each project from a point adjacent module backside 38 to module mount plane 60. Heat spreader extension 40 and terminal extensions 42, 44 have substantially equivalent thicknesses, as measured along axes orthogonal to substrate backside 38; that is, along axes parallel to the Y-axis of coordinate legend 62 (FIG. 3). In embodiments, heat spreader extension 40 and terminal extensions 42, 44 may each have a thickness range from about 1000 to about 100,000 microns (μm) or, more preferably, from 400 to 40,000 μm. In other embodiments, extensions 40, 42, 44 may have thicknesses greater than or less than the aforementioned ranges, as discussed more fully below in conjunction with FIG. 10. This notwithstanding, extensions 40, 42, 44 are not required to have equivalent thicknesses or to terminate at a common mount plane in all embodiments, and more complex mounting schemes can be complemented in which one or more of extensions 40, 42, 44 may project beyond module mount plane 60, depending upon the interface between module 22 and system substrate 20 (FIG. 1).

As briefly indicated above, heat spreader extension 40 can assume the form of any prefabricated structure or part having a relatively high thermal conductivity exceeding that of dielectric body 46. In many cases, heat spreader extension 40 will possess a thermal conductivity substantially equivalent to or greater than that of substrate-embedded heat spreader 50. Generally, heat spreader extension 40 can be composed of a metallic material, a non-metallic material, or a composite material having a relatively high thermal conductivity; e.g., a thermal conductivity approaching or exceeding 50 W/mK. Suitable metallic materials include Al, Cu, and Ni, as well as alloys thereof. Suitable non-metallic materials and composites include diamond polycarbonate materials, diamond-metal composites (e.g., diamond Au, diamond Ag, and diamond Cu), pyrolytic graphite, and materials containing allotropes of carbon, such as graphene and carbon nanotube-filled materials. In the exemplary embodiment shown in FIGS. 1-3, heat spreader extension 40 is provided as a prefabricated structure and, specifically, as a singulated piece of a leadframe. Terminal extensions 42 are likewise provided as singulated pieces of leadframe in the illustrated example, as further described below in conjunction with FIG. 8. In other embodiments, heat spreader extension 40 may not be provided as a singulated piece of a leadframe; and may, instead, assume the form of a discrete prefabricated part, such as a metallic slug or coin, as further described below.

Heat spreader extension 40 may be electrically active in at least some embodiments of microelectronic module 22. In such embodiments, heat spreader extension 40 may combine with substrate-embedded heat spreader 50 and, perhaps, other electrically-conductive features of microelectronic module 22 (e.g., electrical routing features 48) to allow power supply to, electrical grounding of, and/or signal communication with any number of microelectronic devices 32, 34 (FIG. 1). For example, an electrical grounding path may be provided from one or more of microelectronic devices 32, 34, through substrate-embedded heat spreader 50, through central (heat spreader-contacting) portion 56 of sintered bond layer 54, through heat spreader extension 40, and to module mount plane 60 in embodiments. In this manner, one or more of microelectronic devices 32, 34 may be electrically coupled to ground through a low resistivity electrical path, which is principally formed by substrate-embedded heat spreader 50 and heat spreader extension 40. More specifically, in one non-limiting implementation, microelectronic devices 32 may assume the form of semiconductor die bearing RF circuitry, which is electrically coupled to an electrically-grounded feature of PCB 20 (e.g., thermally-conductive structure in dashed region 26 shown in FIG. 1, as provided in the form of a via farm, an embedded coin, or a press-fit coin) through substrate-embedded heat spreader 50 and heat spreader extension 40.

As shown most clearly in FIG. 2, which shows the system substrate 20 and the thermal extension level 30 with the module substrate 28 removed, heat spreader extension 40 may include a central portion or main body 64, which has planform dimensions generally corresponding to those of lower principal surface 66 (identified in FIG. 3) of substrate-embedded heat spreader 50. Heat spreader extension 40 may also include one or more peripheral projections or wings 68, which project from main body 64 in lateral directions; that is, along the X-Z plane of coordinate legend 62 (FIG. 3). When provided, wings 68 may extend beneath selected ones of substrate-embedded terminals 52 and, perhaps, may be placed in electrical and thermal communication therewith through terminal-contacting portions 58 of bond layer 54. For example, in embodiments in which heat spreader extension 40 is electrically grounded, wings 68 may extend beneath, be bonded to, and electrically communicate with certain substrate-embedded terminals 52 that are likewise electrically grounded. Additionally or alternatively, one or more wings 68 of heat spreader extension 40 may extend beneath, and be bonded to, electrically inactive or "dummy" terminals included in substrate-embedded terminals 52. Wings 68 are usefully formed to increase the overall heat spreading capabilities of heat spreader extension 40 and thereby further boost the heat dissipation capabilities of module 22. Additionally, in embodiments in which at least heat spreader extension 40 is provided as a singulated piece of a leadframe, wings 68 may be leveraged as spars or tie bars initially connecting main body 64 of extension 40 to the larger leadframe, as discussed more fully below in conjunction with FIG. 8. In other embodiments, such as when heat spreader extension 40 is provided as a discretely-placed piece (rather than in leadframe format), heat spreader extension 40 may lack wings 68.

The maximum thicknesses of substrate-embedded heat spreader 50 and heat spreader extension 40 are identified in FIG. 3 by double-headed arrows $T_1$ and $T_2$, respectively. When provided as a prefabricated structure, heat spreader extension 40 may be imparted with a maximum thickness equal to or greater than that of substrate-embedded heat spreader 50 such that $T_1 < T_2$ in certain instances. In other embodiments, heat spreader extension 40 may be thinner than heat spreader 50. By way of non-limiting example, the maximum thickness of substrate-embedded heat spreader 50 ($T_1$) may range between 8 and 50 millimeters (mils) in embodiments, while the maximum thickness of heat spreader extension 40 ($T_2$) ranges between 2 and 100 mils. In yet other implementations, heat spreader 50 and/or heat spreader extension 40 may be thicker or thinner than the aforementioned ranges. Comparatively, the maximum thickness of module substrate 28 (identified in FIG. 3 by double-headed arrow $T_3$) will typically be greater than or equal to that of heat spreader 50 ($T_1$), depending upon whether heat spreader 50 extends through the entirety of substrate 28 to breach substrate frontside 36 and substrate backside 38. Lastly, the thickness of sintered bond layer 54 (identified by double-headed arrow $T_4$) may range between 5 and 100 μm in an exemplary embodiment.

The provision of heat spreader extension 40 and, more generally, of thermal extension level 30 may favorably increase the heat dissipation capabilities of microelectronic module 22 in a number of manners. First, heat spreader extension 40 increases the overall thermal dissipation capabilities of microelectronic module 22, generally considered, to more uniformly distribute thermal gradients across module 22. Second, and as previously noted, heat spreader extension 40 and substrate-embedded heat spreader 50 cooperate or combine to form a highly conductive thermal conduit extending from an upper portion of module substrate 28, through dielectric body 46, through heat spreader extension 40, and to module mount plane 60. Thus, when mounted to system substrate 20 (FIG. 1), excess heat generated by microelectronic devices 32, 34 (FIG. 1) can be conductively transferred through substrate-embedded heat spreader 50, through heat spreader extension 40, and to substrate 20 to remove excess heat from module 22 in a highly efficient manner. Third, as shown in FIGS. 1-3, thermal extension level 30 may be left unencapsulated and directly exposed to the ambient environment to further promote convective transfer of excess heat from module 22, particularly from heat spreader extension 40, to the surrounding environment. Such convective heat transfer can be further promoted, if desired, by directing forced airflow through or otherwise cooling thermal extension level 30. By more effectively removing or dissipating excess heat from module 22, microelectronic devices 32, 34 can be operated at higher power levels with little to no performance degradation. This is highly desirable, particularly when microelectronic devices 32, 34 provide high power RF functionalities.

Examples of Microelectronic Module Fabrication Methods

An exemplary fabrication process for manufacturing microelectronic module 22 shown in FIGS. 1-3, along with a plurality of identical modules, will now be described in conjunction with FIGS. 4-8. If desired, a multi-substrate panel may be processed to produce a number of microelectronic modules 22 in parallel for increased process efficiency. An example of such a multi-substrate panel 70 is shown in FIGS. 4 and 5, which illustrate the frontside and backside of panel 70, respectively. In this example, multi-substrate panel 70 has a strip-like form factor and contains a plurality of module substrates 28, which are physically connected at the present juncture of manufacture and arranged into two grids 72. For ease of description, the following will focus on the processing of four interconnected module substrates 28 contained in dashed rectangle 74 appearing in each of FIGS. 4 and 5. It will be appreciated, however, that the below-described process steps will be performed globally across panel 70 for all interconnected module substrates 28 to yield a relatively large number of microelectronic modules 22. Also, in other embodiments, the depicted microelectronic modules can be manufactured on an individual basis or utilizing a different fabrication approach. Furthermore, the below-described process steps are provided by way of non-limiting example only. In alternative implementations, the below-described process steps may be performed in alternative sequences, certain steps may be omitted, and various other process steps can be introduced into the fabrication process Referring to FIG. 6, backsides 38 of four module substrates 28 included in multi-substrate panel 70 (FIGS. 3-4) are shown prior to attachment of thermal extension levels 30. Here, it can be seen that the lower principal surfaces of substrate-embedded heat spreaders 50 and substrate-embedded terminals 52 are visible through the respective backsides 38 of interconnected substrates 28. Additionally, a number of intersecting saw lanes 76 are identified in FIG. 6. As discussed below, multi-substrate panel 70 and the below-described extension level leadframe may be cut or otherwise separated along saw lanes 76 during singulation to separate microelectronic modules 22' into discrete units. In FIG. 6, and also in FIGS. 7-8, the prime symbol (') is appended to those reference numerals designating structural elements or items in a non-completed or transitional state. For example, in each of FIGS. 6-8, the illustrated microelectronic modules are shown in a partially completed state and are thus identified utilizing reference numeral "22'."

Figure 7:
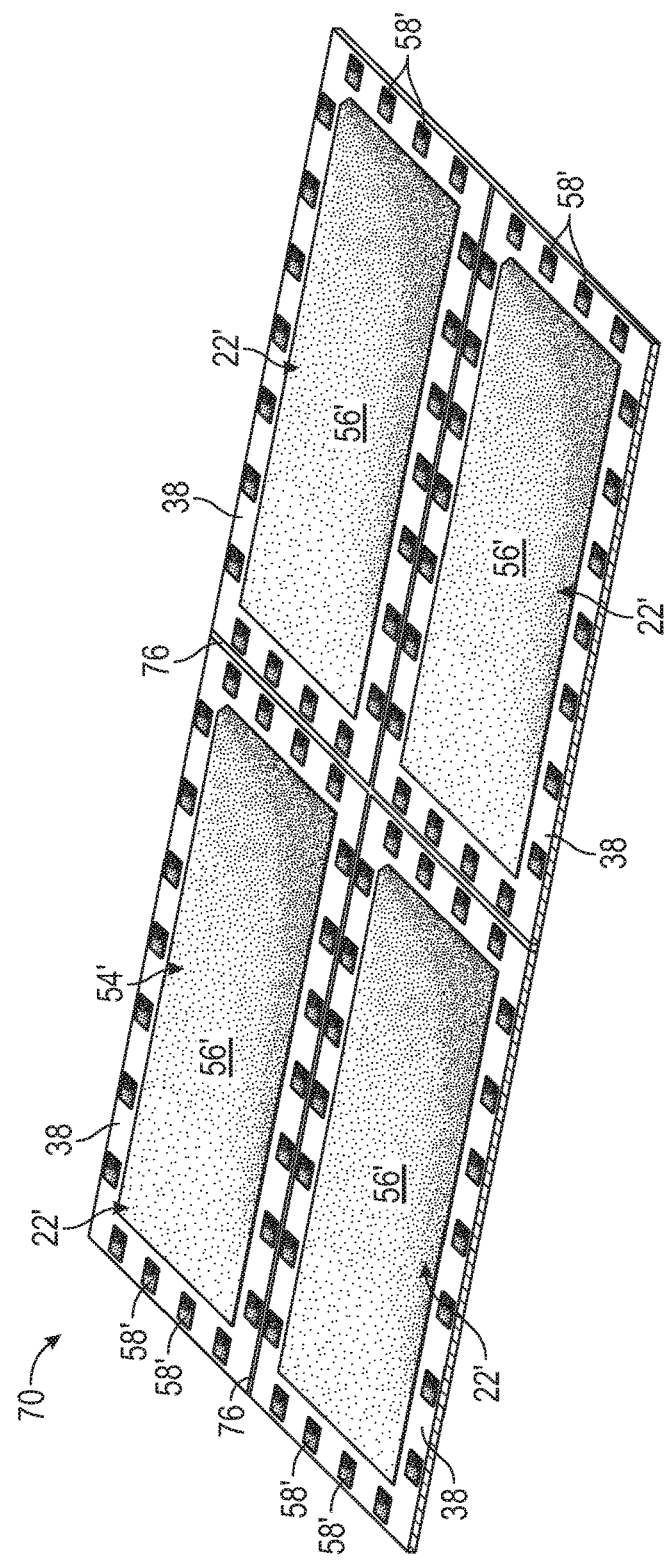

Advancing to FIG. 7, a bond layer precursor material 54' (represented by dot stippling) is applied over the exposed surfaces of substrate-embedded heat spreaders 50 and substrate-embedded terminals 52. In the illustrated example, bond layer precursor material 54' is deposited onto panel 70 in a predetermined pattern including heat spreader-contacting portions 56', which are deposited onto substrate-embedded heat spreaders 50; and terminal-contacting portions 58', which are deposited onto substrate-embedded terminals 52. Bond layer precursor material 54' may be composed of die attach epoxy, a solder paste, a die attach material, or another such material that can processed (e.g., via thermal or ultraviolet curing) to yield a thermally-conductive bond layer of the type discussed above. For example, in embodiments, bond layer precursor material 54' can be applied in a dry state as, for example, a thin film or B-stage epoxy. Alternatively, in other embodiments, bond layer precursor material 54' can be deposited in the desired pattern utilizing a wet state application process, such as screen printing or fine needle dispense. As still further possibility, bond layer precursor material 54' may instead be applied to the appropriate surfaces of the below-described extension level leadframe by dipping, patterned dispensing (e.g., screen printing), as a dry film, or utilizing another approach; and then brought into contact with the exposed surfaces of substrate-embedded heat spreaders 50 and substrate-embedded terminals 52 when the leadframe is positioned against multi-substrate panel 70, as described below.

Figure 8:
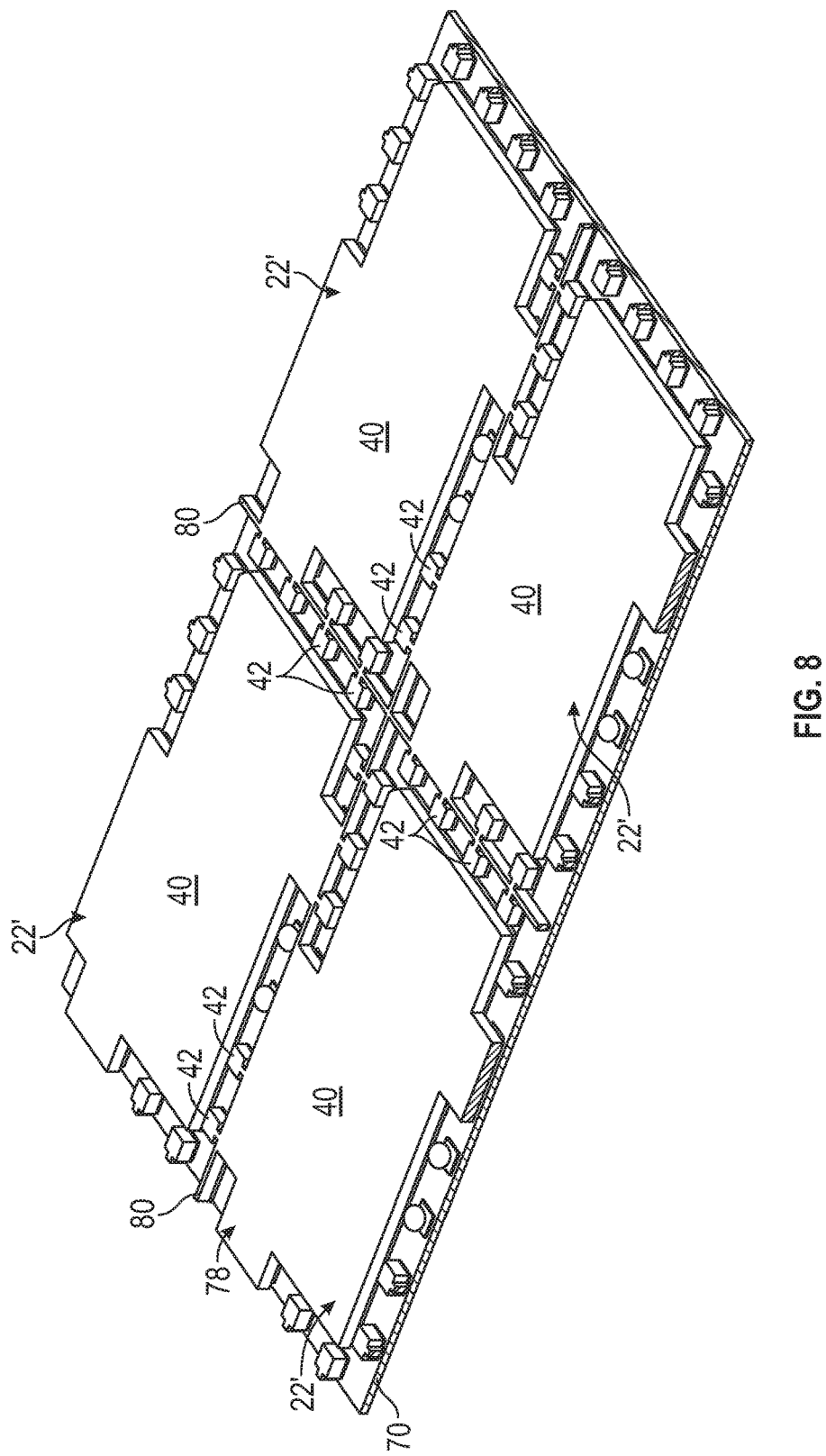

Turning to FIG. 8, an extension level leadframe 78 (partially shown) is next positioned over and against multi-substrate panel 70. Extension level leadframe 78 contains a number of thermal extension levels 30, which are interconnected by intervening frame-like structure referred to as "tie bars 80." Specifically, as indicated in FIG. 8, tie bars 80 are physically connected to terminal extensions 42 and to heat spreader extensions 40 through the wings thereof prior to singulation of leadframe 78. Extension level leadframe 78 may have various other form factors in further embodiments, depending upon the design of modules 22'. Further, extension level leadframe 78 may be utilized to only provide a subset of the features included in thermal extension levels 30 in certain implementations. For example, as indicated in FIG. 8, terminal extensions 44 (e.g., solder-covered balls) included in thermal extension level 30 may have a solder finish and be placed independently of leadframe 78; e.g., utilizing a pick-and-place tool or fixture, such as a template having openings for receiving and positioning terminal extensions 44 and, perhaps, heat spreader extension 40. Further, in embodiments in which bond layer precursor material 54' is composed of a metal particle-containing precursor material, as described below, a common process may be utilized to reflow the solder finishes of extensions 44, while also performing low temperature sintering of precursor material 54'. In yet further embodiments, substrate-embedded heat spreaders 50 and substrate-embedded terminals 52 may likewise be provided as discretely placed pieces or parts, rather than provided as part of a larger leadframe.

After positioning of extension level leadframe 78 against bond layer precursor material 54', precursor material 54' may be subject to curing, as needed. As appearing herein, sintering processes are considered a type of "curing," as are other techniques (including solder reflow) involving the application of heat, pressure, and/or particular wavelengths of light utilized to process a material into its final form or composition. Thus, in embodiments in which bond layer precursor material 54' is a metal particle-containing paste, a low temperature sintering process may be performed to transform precursor material 54' into sintered bond layer 54. An example of such a low temperature sintering process will be described below, and further discussions of such sintering processes can be found in the following documents, which are hereby incorporated by reference: U.S. patent application Ser. No. 15/832,479, entitled "MICROELECTRONIC COMPONENTS HAVING INTEGRATED HEAT DISSIPATION POSTS, SYSTEMS INCLUDING THE SAME, AND METHODS FOR THE FABRICATION THEREOF," and filed with the USPTO on Dec. 5, 2017.

As noted above, bond layer precursor material 54' may be a sinter precursor material in embodiments. In such embodiments, the sinter precursor material can be applied in various different manners including both wet state and dry state application techniques. Suitable wet state application techniques include, but are not limited to, screen or stencil printing, doctor blading, spraying, dipping, and fine needle dispense techniques. When a wet state application technique is employed, a flowable or wet state coating precursor material is initially obtained by, for example, independent production or purchase from a third party supplier. In addition to metal particles (described below), the wet state coating precursor material contains other ingredients (e.g., a solvent and/or surfactant) to facilitate wet set application, to adjust the viscosity of the precursor material, to prevent premature agglomeration of the metal particles, or to serve other purposes. In one embodiment, the wet state coating precursor material contains metal particles in combination with a binder (e.g., an epoxy), a dispersant, and a thinner or liquid carrier. The volume of solvent or liquid carrier contained within the coating precursor material can be adjusted to tailor of the viscosity of the precursor material to the selected wet state application technique. For example, in embodiments wherein the precursor material is applied by screen printing or doctor blading, the coating precursor material may contain sufficient liquid to create a paste, slurry, or paint. After application of the wet state coating material, a drying process can be carried-out to remove excess liquid from the sinter precursor material, if so desired.

In further embodiments, the sinter precursor material can be applied utilizing a dry state application technique. For example, a film transfer process can be employed to apply the precursor material to the appropriate component surfaces. In this regard, a dry film may first be prepared by, for example, initially depositing (e.g., screen printing or otherwise dispensing) one or more sinter precursor material onto a temporary substrate or carrier, such as a plastic (e.g., polyethylene terephthalate) tape backing. The sinter precursor material may be applied to the carrier in a wet, flowable state and then heated or otherwise dried to yield a dry film, which is transferred to the appropriate package component surfaces. Heat, pressure, or both heat and pressure are then applied to adhere the metal particle-containing precursor layer (dry film) to the appropriate component surfaces. The carrier (e.g., tape backing) may then be removed by physical removal (e.g., peeling away) or by dissolution in a chemical solvent. This process may then be repeated to apply additional sinter precursor material to other component surfaces, as appropriate. In still further embodiments, one or more freestanding films may simply be positioned between the microelectronic module components during stacking or build-up (also considered "film transfer" in the context of this document).

The metal particles dispersed within the sinter precursor material can have any composition, shape, and size enabling the particles to form a substantially coherent adhesive layer pursuant to the below-described sintering process. In one embodiment, the sinter precursor material contains Au, Ag, or Cu particles, or a mixture thereof. In another embodiment, the metal particles contained within the precursor material consist essentially of Ag or Cu particles. The metal particles contained within the precursor material may or may not be coated with an organic material. For example, in some implementations, the metal particles may be coated with an organic dispersant, which prevents physical contact between the particles to inhibit premature agglomeration or particle sintering. When present, any such organic particle coating may be burned away or thermally decomposed, whether in whole or in part, during the below-described metal sintering process. In still further embodiments, other material systems amenable to low temperature sintering, whether currently known or later developed, may be utilized during the module fabrication process.

The metal particles contained within the precursor material can have any shape or combination of shapes including, but not limited to, spherical shapes, oblong shapes, and platelet or laminae shapes. The average dimensions of the metal particles will vary in conjunction with particle shape and process parameters. However, in general, the average maximum dimension of the metal particles (e.g., the diameter of the metal particles when spherical or the major axis of the metal particles when oblong) may be between about 100 μm and about 10 nanometers (nm) in an embodiment. In other embodiments, the metal particles may have average maximum dimension greater than or less than the aforementioned range. In certain implementations, a mixture of metal particles having average maximum dimensions in both the nanometer and micron range may be present within the precursor material. In other implementations, only nanoparticles (that is, particles having average maximum dimension between 1 and 1000 nm) may be contained within the sinter precursor material. As a specific, albeit non-limiting example, the precursor material may contain at least one of Ag, Au, or Cu nanoparticles or micron-sized particles in an embodiment, with Ag or Cu nanoparticles preferred.

As noted above, a low temperature sintering process is performed to produce the desired metal sinter layers after application of the sinter precursor material. The low temperature sintering process can be carried-out under any process conditions suitable for transforming the sinter precursor material into metal sinter layers, noting that some diffusion may occur from the precursor material into contacting components of the microelectronic modules. The sinter bond process thus advantageously forms low stress, mechanically-robust, solid state metallurgical diffusion bonds at the bond joint interfaces. The sintering process may be performed with or without pressure, with or without heating (although some degree of elevated heat will typically be applied), and in any suitable atmosphere (e.g., open air or in the presence of an inert gas, such as nitrogen). As a point of emphasis, the sintering process is carried-out at maximum processing temperatures ($T_{MAX}$) less than the melt point of the metal particles contained within the precursor material. Indeed, in many embodiments, $T_{MAX}$ will be significantly less than the melt point of the metal particles and, perhaps, less than one half the melt point of the particles considered on an absolute temperature scale (in Kelvin). Generally, $T_{MAX}$ will be greater than room temperature (considered 20° C. herein) and less than 300° C. Comparatively, the melt point of Ag, Au, and Cu particles in a nanometer or micron size range will commonly range between approximately 950° C. to 1100° C. To provide a still further example, $T_{MAX}$ may be between approximately 170° C. and 300° C. in an embodiment. In still further embodiments, $T_{MAX}$ may be greater than or less than the aforementioned range, providing that $T_{MAX}$ (in conjunction with the other process parameters) is sufficient to induce sintering of the metal particles without liquefaction of the metal particles.

A multistage heating schedule can be employed during the sintering process. In this case, the multistage heating schedule may entail heating microelectronic modules 22, in a partially fabricated state, to a first temperature (Ti) less than $T_{MAX}$ for a first time period, gradually increasing or ramping-up the temperature process to $T_{MAX}$, and then maintaining $T_{MAX}$ for a second time period. A cool down period may follow. In one embodiment, and by way of non-limiting example only, $T_1$ may range from approximately 100 to 200° C., while $T_{MAX}$ is greater than $T_1$ and ranges from approximately 170 to 280° C. As discussed below, the process parameters employed may or may not be controlled to fully decompose any organic material from the sinter precursor material during the sintering process.

In at least some implementations of the microelectronic module fabrication method, a controlled convergent pressure or compressive force is applied across the partially-fabricated microelectronic modules during the sintering process. When applied, the convergent pressure can be delivered as a substantially constant force or, instead, varied in accordance with a time-based or temperature-based schedule. Any suitable mechanism can be utilized to apply the desired convergent pressure including bulk weights, resilient bias devices (e.g., spring-loaded plungers or pins), clamps, hydraulic presses, and the like. The pressure applied may be selected based upon various factors including the desired final thickness of the metal sinter layers, the desired porosity of the metal sinter layers, and the composition of the sinter precursor material. In one embodiment, and by way of non-limiting example only, a maximum pressure ($P_{MAX}$) ranging between about 0.5 and about 20 megapascal (Mpa) is applied during the sintering process. In other embodiments, $P_{MAX}$ may be greater than or less than the aforementioned range, if pressure is applied during the sintering process.

After bonding thermal extension levels 30 to module substrates 28, singulation is performed to separate microelectronic modules 22' into individual units. As indicated above, singulation may be carried-out by directing a suitable cutting tool (e.g., a dicing saw) along saw lanes 76 (FIGS. 6 and 7) to separate multi-substrate panel 70 into individual substrates 28 and to sever the connections between heat spreader extensions 40, terminal extensions 42, and tie bars 80. This, in turn, results in the electrical isolation of heat spreader extensions 40 and terminal extensions 42, which may include spars extending to an outer periphery of each module 22. Attachment and interconnection of microelectronic devices 32, 34 (FIG. 1) is advantageously performed prior to panel singulation, although this is not necessary in all embodiments. The end result is a plurality of completed microelectronic modules 22 similar or substantially identical to that shown in FIGS. 1-3, as previously described.

Figure 9:
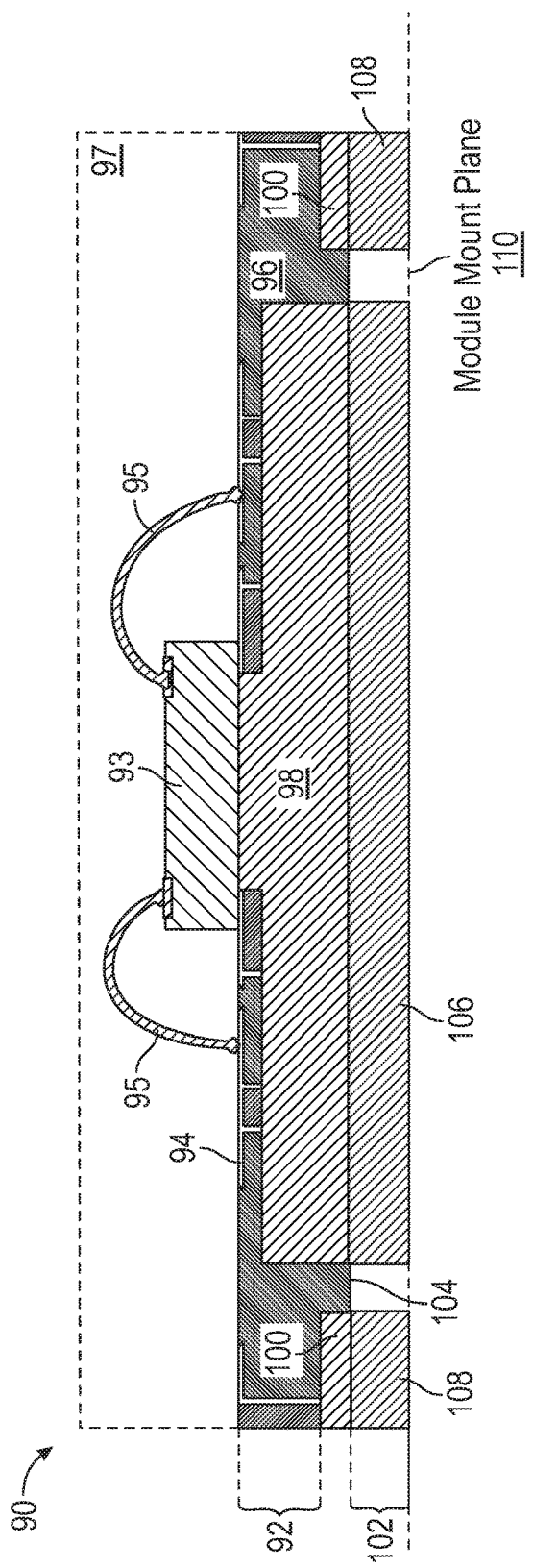
FIG. 9 is a cross-sectional view of a high thermal performance microelectronic module including a plated thermal extension level, as illustrated in accordance with a further exemplary embodiment of the present disclosure.

Alternative Embodiments of Microelectronic Modules Including Thermal Extension Levels FIG. 9 is a cross-sectional view of a high thermal performance microelectronic module 90, as depicted in accordance with a further exemplary embodiment of the present disclosure. In many respects, microelectronic module 90 is similar to module 22 described above in conjunction with FIGS. 1-8. For example, as does microelectronic module 22, high thermal performance microelectronic module 90 includes a module substrate 92 to which any number and type of microelectronic devices may be mounted and electrically interconnected with the routing features of module substrate 92. In this regard, a microelectronic device 93, such as a semiconductor die, may be attached to substrate 92 and electrically interconnected utilizing wirebonds 95. Microelectronic module 90 may also contain any practical number and type of additional microelectronic devices, which are hidden from view in the cross-section of FIG. 9. An enclosure 97 (e.g., an overmolded body or lidded container defining an air cavity) may further be provided to house microelectronic device 93 and any other devices contained in microelectronic module 90 in at least some implementations.

Module substrate 92 assumes the form of a PCB including a number of metal levels or wiring layers 94 contained in a dielectric body 96. A substrate-embedded heat spreader 98 is again provided in a central portion of dielectric body 96, as are a plurality of substrate-embedded terminals 100 spaced around a lower periphery of a heat spreader 98. As was previously the case, a thermal extension level 102 is positioned adjacent and bonded to backside 104 of module substrate 92. Specifically, thermal extension level 102 includes a heat spreader extension 106 bonded to the lower principal surface of substrate-embedded heat spreader 98, which is substantially coplanar with backside 104 of module substrate 92. Additionally, thermal extension level 102 includes terminal extensions 108, which are bonded to the lower surfaces of substrate-embedded terminals 100. Once again, extensions 106, 108 have substantially equivalent thickness and extend from points adjacent substrate backside 104 to terminate at a module mount plane 110.

In contrast to thermal extension level 30 of microelectronic module 22 (FIGS. 1-3), the structures of thermal extension level 102 are produced via deposition of a thermally-conductive material over the surfaces of substrate-embedded heat spreader 98 and substrate-embedded terminals 100 exposed at backside 104 of module substrate 92. In one embodiment, an alloy consisting essentially of Cu, or containing Cu as a primary constituent, is plated over the exposed surfaces of heat spreader 98 and terminals 100. The particular thickness to which extensions 106, 108 are plated or are otherwise deposited will vary in embodiments, but may be range between 5 and 20 mils in one non-limiting example. Plated thermal extension level 102 may consequently increase the heat rejection capabilities of microelectronic module 90 in a manner analogous to that described above in conjunction with FIGS. 1-3. Furthermore, the aforementioned approaches can also be combined to yield still further embodiments of the high thermal performance microelectronic module. For example, in yet other embodiments, thermal extension level 102 may be produced by initially attaching prefabricated structures in the form of a heat spreader extension and/or terminal extensions to module substrate 92 and, afterwards, one or more plating layers may be formed thereover, if so desired. Conversely, thermal extension level 102 may be formed by first electrodepositing a patterned plating level, as shown in FIG. 9, and then subsequently attaching one or more prefabricated structures to the newly-deposited plating layer utilizing a thermally-conductive bond layer in the manner previously described.

CONCLUSION

The foregoing has thus provided high thermal performance microelectronic modules including thermal extension levels, as well as methods for manufacturing high thermal performance microelectronic modules. As described above, the microelectronic modules contain unique structures or features enhancing thermal dissipation of excess heat generated by microelectronic devices, such as semiconductor (e.g., RF) die and other circuitry, contained within a given module. Such structures will generally include at least one heat spreader extension, which is contained in a thermal extension level located adjacent the backside of a module substrate and directly or indirectly bonded thereto. The provision of the heat spreader extension consequently increases the overall thermal dissipation capabilities of the microelectronic module. Further, the heat spreader extension and, more generally, the thermal extension level may be unencapsulated and thus directly exposed to the ambient environment to further promote convective transfer of excess heat from the module to the surrounding environment. This, in turn, allows, significant improvements in the overall thermal performance of the microelectronic module, with only modest increases in fabrication costs and module thicknesses.

Computer simulations were performed demonstrating improvements in thermal performance potentially achieved by embodiments of the high thermal performance microelectronic modules. The results of one such computer simulation are graphically set-forth in FIG. 10. System thermal resistance is plotted along the abscissa (vertical axis) and presented as a percentage of reduction in the system-wide thermal resistance (measured in degrees Celsius over watts) as compared to a baseline heat flow metric through a conventional substrate containing bar vias (represented by trace 112). PCB thickness is further plotted in FIG. 10 along the ordinate (horizonal axis) and ranges 2 to 3.5 mills in this example. As a first point of comparison, system thermal resistivity lowered by approximately 10% to approximately 11.5% were achieved for a heat spreader extension composed of Cu, having a thickness of 5 mil thickness, and attached to a substrate-embedded heat spreader by an Ag sinter layer (represented by trace 114). Comparatively, as second, third, and fourth points, the exemplary simulations demonstrated reductions in system thermal resistance ranging from about 16% to about 20% were seen for the same heat spreader extension configuration, but having 20, 35, and 50 mil thickness, respectively. Thus, as can be seen, increases in heat spreader extension thickness exceeding about 50 mils provides relatively little reduction in system thermal resistivity. Accordingly, in an embodiment, the heat spreader extension and, more generally, the thermal extension level may be imparted with a thickness ranging from 5 to 50 mil inclusive and, more preferably, a thickness ranging from 5 mil to 20 mil inclusive. In other embodiments, the heat spreader extension and the thermal extension level may be thicker or thinner than the aforementioned ranges.

As noted above, the various structures contained in the thermal extension level can be provided as discrete, prefabricated components or may instead be deposited utilizing, for example, a plating process. When assuming the form of prefabricated components, the structures of the thermal extension level are conveniently, although not necessarily initially provided in leadframe form. It is also possible for the heat spreader extension to be provided in leadframe form, while the terminal extensions (if included in the thermal extension level) are provided as discrete pieces or structures. In this latter regard, the terminal extensions can be provided as discretely-placed pieces having any desired shape (e.g., rods, cubes or spheres) and that bonded to exposed surfaces of the substrate-embedded terminals utilizing a suitable electrically-conductive bonding material. For example, when the terminal extensions (and possibly the heat spreader extension) are provided as discrete structures, the terminal extensions may have a solderable surface (and, perhaps, solder plating), which is joined to the exposed surfaces of the substrate-embedded terminals by soldering. Placement of the terminal extensions can be streamlined utilizing a template having openings corresponding to the desired spatial arrangement of the terminal extensions, although individual placement of extensions can also be performed (e.g., utilizing a pick-and-place tool) if desired. In one approach (which is generically illustrated in FIGS. 2-3), terminal extensions 44 may be joined to substrate-embedded terminals or contact pads 52 by a layer portion 58 composed of solder, while heat spreader extension 40 is joined to substrate-embedded heat spreader 50 by layer portion 56 composed of a sintered (e.g., Ag) material. Such an approach provides temperature capability advantages (generally avoiding solder fatigue issues, which can limit maximum solder temperature) and improved thermal conductivity.

In one embodiment, the above-described microelectronic module includes a module substrate, which has a substrate frontside and a substrate backside; and a microelectronic device, which is mounted to the substrate frontside. A substrate-embedded heat spreader is thermally coupled to the microelectronic device, is at least partially contained within the module substrate, and has a lower principal surface that is substantially parallel with the substrate backside. For example, the substrate-embedded heat spreader extend beyond the substrate backside, be recessed with respect to the substrate backside by some amount, or extend to the substrate backside (in which case, the lower principal surface of the heat spreader may be substantially coplanar with the substrate backside). The microelectronic module further contains thermal extension level, which is located adjacent the substrate backside and which extends away therefrom to terminate a module mount plane. The thermal extension level includes a heat spreader extension, which is bonded to and placed in thermal communication with the substrate-embedded heat spreader. In certain embodiments, the heat spreader extension may include a main body from which one or more wings extend laterally to, for example, cover one or more substrate-embedded terminals contained in the module substrate. In such embodiments, the wing or wings may be electrically coupled to the substrate-embedded terminals, possibly with the substrate-embedded terminals and the heat spreader extension coupled to electrical grounded. In other implementations, the heat spreader extension may not include any such wings.

In another embodiment, the microelectronic module includes a module substrate having a substrate frontside and a substrate backside, microelectronic devices mounted to the substrate frontside, and a substrate-embedded heat spreader at least partially contained within the module substrate, thermally coupled to at least one of the microelectronic devices, and having a lower principal surface that is parallel to (and, perhaps, coplanar with) the substrate backside. Substrate-embedded terminals are electrically coupled to the microelectronic devices and likewise have lower principal surfaces that are parallel to (and possibly coplanar with) the substrate backside. For example, in embodiments, the substrate-embedded heat spreader and the substrate-embedded terminals may each extend to the substrate backside. A thermal extension level includes a plurality of terminal extensions and a heat spreader extension. The terminal extensions are electrically attached to the substrate-embedded terminals and extend away from the substrate backside to terminate at a module mount plane substantially parallel to the substrate backside. The heat spreader extension is electrically attached to the substrate-embedded heat spreader, extends away from the substrate backside to terminate, and further terminates at the module mount plane. In certain implementations, at least one of the plurality of terminal extensions assumes the form of a solder-covered contact including (i) an inner core having a first thermal conductivity, and (ii) an outer shell composed of solder and having a second thermal conductivity less than the first thermal conductivity.

Methods for fabricating microelectronic modules have further been provided. The microelectronic modules produced pursuant to such methods may include a module substrate and a substrate-embedded heat spreader, which is at least partially contained within the module substrate and which has a lower principal surface substantially parallel with and, perhaps, substantially coplanar with a lower principal surface or backside of the module substrate. In various embodiments, the method includes providing a thermal extension level adjacent the backside of the module substrate and extending away therefrom to terminate a module mount plane. The thermal extension level contains a heat spreader extension bonded to the lower principal surface of the substrate-embedded heat spreader. Before or after providing the thermal extension level, at least one microelectronic device is mounted or attached to a frontside of the module substrate such that the heat spreader extension is placed in thermal communication with the microelectronic device through the substrate-embedded heat spreader when the heat spreader extension is bonded thereto.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

As appearing in the foregoing Detailed Description, terms such as "comprise," "include," "have," and the like are intended to cover non-exclusive inclusions, such that a process, method, article, or apparatus that comprises a list of elements is not necessarily limited to those elements, but can include other elements not expressly listed or inherent to such process, method, article, or apparatus. As still further appearing herein, terms such as "over," "under," "on," and the like are utilized to indicate relative position between two structural elements or layers and not necessarily to denote physical contact between structural elements or layers. Thus, a first structure or layer can be described as fabricated "over" or "on" a second structure, layer, or substrate without indicating that the first structure or layer necessarily contacts the second structure, layer, or substrate due to, for example, presence of one or more intervening layers.

What is claimed is:

1. A microelectronic module, comprising: a module substrate having a substrate frontside and a substrate backside: a microelectronic device mounted to the substrate frontside: a substrate-embedded heat spreader thermally coupled to the microelectronic device, at least partially contained within the module substrate, and having a lower surface parallel with the substrate backside: substrate-embedded terminals contained in the module substrate and having lower surfaces parallel with the substrate backside: and a thermal extension level adjacent the substrate backside and extending away therefrom to terminate at a module mount plane, the thermal extension level comprising: a heat spreader extension bonded to and in thermal communication with the substrate-embedded heat spreader: and terminal extensions bonded to the substrate-embedded terminals, the microelectronic device electrically coupled to the terminal extensions through the substrate-embedded terminals; wherein the module substrate and at least one of the terminal extensions comprise singulated portions of a leadframe.

2. The microelectronic module of claim 1 further comprising a thermally-conductive bond layer bonding the heat spreader extension to the substrate-embedded heat spreader.

3. The microelectronic module of claim 1 further comprising an electrical grounding path extending from the microelectronic device, through the substrate-embedded heat spreader, and to the heat spreader extension.

4. The microelectronic module of claim 1 wherein the terminal extensions have thicknesses substantially equivalent to a thickness of the heat spreader extension, as taken along an axis orthogonal to the substrate backside.

5. A microelectronic module, comprising: a module substrate having a substrate frontside and a substrate backside: a microelectronic device mounted to the substrate frontside: a substrate-embedded heat spreader thermally coupled to the microelectronic device, at least partially contained within the module substrate, and having a lower surface parallel with the substrate backside: substrate-embedded terminals contained in the module substrate and having lower surfaces parallel with the substrate backside: and a thermal extension level adjacent the substrate backside and extending away therefrom to terminate at a module mount plane, the thermal extension level comprising: a heat spreader extension bonded to and in thermal communication with the substrate-embedded heat spreader, the heat spread extension comprising: a main body underlying the substrate-embedded heat spreader, as taken along a first axis orthogonal to the substrate backside; and at least one wing extending laterally from the main body to cover at least one of the substrate-embedded terminals, as taken along a second axis orthogonal to the substrate backside: and terminal extensions bonded to the substrate-embedded terminals, the microelectronic device electrically coupled to the terminal extensions through the substrate-embedded terminals.

6. The microelectronic module of claim 5 wherein the terminal extensions have thicknesses substantially equivalent to a thickness of the heat spreader extension, as taken along an axis orthogonal to the substrate backside.

7. The microelectronic module of claim 5 wherein the module substrate and at least one of the terminal extensions comprise singulated portions of a leadframe.

8. The microelectronic module of claim 5 further comprising a thermally-conductive bond layer bonding the heat spreader extension to the substrate-embedded heat spreader.

9. The microelectronic module of claim 5 further comprising an electrical grounding path extending from the microelectronic device, through the substrate-embedded heat spreader, and to the heat spreader extension.

10. A microelectronic module, comprising: a module substrate having a substrate frontside and a substrate backside: a microelectronic device mounted to the substrate frontside: a substrate-embedded heat spreader thermally coupled to the microelectronic device, at least partially contained within the module substrate, and having a lower surface parallel with the substrate backside: and a thermal extension level adjacent the substrate backside and extending away therefrom to terminate at a module mount plane, the thermal extension level comprising a heat spreader extension bonded to and in thermal communication with the substrate-embedded heat spreader, the heat spreader extension composed of a metallic material plated directly onto the substrate-embedded heat spreader; and further comprising substrate-embedded terminals contained in the module substrate and having lower surfaces parallel with the substrate backside; wherein the thermal extension level further comprises terminal extensions bonded to the substrate-embedded terminals, the microelectronic device electrically coupled to the terminal extensions through the substrate-embedded terminals.

11. The microelectronic module of claim 10 further comprising substrate-embedded terminals contained in the module substrate and having lower surfaces parallel with the substrate backside;
  wherein the thermal extension level further comprises terminal extensions bonded to the substrate-embedded terminals, the microelectronic device electrically coupled to the terminal extensions through the substrate-embedded terminals.

12. The microelectronic module of claim 11 wherein the terminal extensions have thicknesses substantially equivalent to a thickness of the heat spreader extension, as taken along an axis orthogonal to the substrate backside.

13. The microelectronic module of claim 10 wherein the heat spreader extension comprises:
  a main body underlying the substrate-embedded heat spreader, as taken along a first axis orthogonal to the substrate backside; and
  at least one wing extending laterally from the main body to cover at least one of the substrate-embedded terminals, as taken along a second axis orthogonal to the substrate backside.

14. The microelectronic module of claim 10 further comprising an electrical grounding path extending from the microelectronic device, through the substrate-embedded heat spreader, and to the heat spreader extension.

15. A microelectronic module, comprising:
  a module substrate having a substrate frontside and a substrate backside;
  microelectronic devices mounted to the substrate frontside;
  a substrate-embedded heat spreader within the module substrate, thermally coupled to at least one of the microelectronic devices, and having a lower surface parallel to the substrate backside; and
  substrate-embedded terminals electrically coupled to the microelectronic devices and having lower surfaces parallel to the substrate backside; and
  a thermal extension level, comprising:
    a plurality of terminal extensions electrically attached to the substrate-embedded terminals, extending away from the substrate backside, and terminating at a module mount plane substantially parallel to the substrate backside, the plurality of terminal extensions comprising spars extending to an outer periphery of the module substrate; and
    a heat spreader extension electrically attached to the substrate-embedded heat spreader and extending from the substrate backside to terminate at the module mount plane.

16. The microelectronic module of claim 15 wherein at least one of the plurality of terminal extensions comprises a solder-covered contact, the solder-covered contact comprising:
  an inner core having a first thermal conductivity; and
  an outer shell composed of solder and having a second thermal conductivity less than the first thermal conductivity.

* * * * *